United States Patent [19]
Kakimoto

[11] Patent Number: 5,486,490
[45] Date of Patent: Jan. 23, 1996

[54] METHOD OF MAKING SEMICONDUCTOR LASER

[75] Inventor: Syoichi Kakimoto, Itami, Japan

[73] Assignee: Mitsubishi Denki Kabushiki Kaisha, Tokyo, Japan

[21] Appl. No.: 298,968

[22] Filed: Sep. 2, 1994

Related U.S. Application Data

[62] Division of Ser. No. 160,748, Dec. 3, 1993, abandoned.

[30] Foreign Application Priority Data

Dec. 15, 1992 [JP] Japan ................................. 4-354578

[51] Int. Cl.⁶ ............................................ H01L 21/20
[52] U.S. Cl. ............................................ 437/129; 437/90
[58] Field of Search ................................. 372/45, 46, 43, 372/49, 44, 99, 103; 437/129, 90, 91

[56] References Cited

FOREIGN PATENT DOCUMENTS

| 0081956 | 12/1982 | European Pat. Off. . |
|---|---|---|
| 0264225 | 10/1987 | European Pat. Off. . |
| 1186693 | 7/1989 | European Pat. Off. . |
| 0472221 | 8/1991 | European Pat. Off. . |
| 0017979 | 1/1985 | Japan ................................. 372/45 |
| 314279 | 1/1991 | Japan . |
| 332084 | 2/1991 | Japan . |
| 4100291 | 4/1992 | Japan . |
| 2237654 | 11/1989 | United Kingdom . |

OTHER PUBLICATIONS

Aoki et al, "Novel Structure MQW Electroabsorption Modulator/DFB–Laser Integrated Device Fabricated By Selective Area MOCVD Growth", Electronics Letters, vol. 27, No. 23, Nov. 1991, pp. 2137–2140.

Shima et al, "High–Power Long–Cavity T³ Laser with a Very Narrow Beam", Japanese Journal of Applied Physics, vol. 28, No. 1, Jan. 1989, pp. 105–107.

Burnham et al, "Semiconductor Injection Lasers with Quantum Size Effect Transparent Waveguiding", Xerox Disclosure Journal, vol. 11, No. 2, Mar./Apr. 1986, pp. 97–100.

Primary Examiner—R. Bruce Breneman
Assistant Examiner—Linda J. Fleck
Attorney, Agent, or Firm—Leydig, Voit & Mayer

[57] ABSTRACT

A method of making a semiconductor laser includes forming spaced apart insulating films on a semiconductor substrate of a first conductivity type defining a central groove and two regions transverse to, contiguous to, and continuous with the central groove, the semiconductor substrate being exposed in the groove and the two regions; successively, epitaxially growing a first cladding layer of a first conductivity type, an active layer including a multiple quantum well structure having alternating well and barrier layers, a second cladding layer of a second conductivity type, opposite the first conductivity type, and a contact layer of the second conductivity type on the semiconductor substrate using a process producing thicker well layers in the groove than in the two regions; and forming first and second electrodes on the substrate and the contact layer, respectively.

6 Claims, 5 Drawing Sheets

5,486,490

METHOD OF MAKING SEMICONDUCTOR LASER

This disclosure is a divisional of application Ser. No. 08/160,748, filed Dec. 3, 1993, now abandoned.

FIELD OF THE INVENTION

The present invention relates to a semiconductor laser including a window structure at facets for producing high power output without catastrophic optical damage (COD) that is produced in a relatively simple process.

BACKGROUND OF THE INVENTION

FIG. 5 is a cross-sectional view of a conventional semiconductor laser including an active layer with a multiple quantum well structure. That laser includes an n-type GaAs substrate 1 and a double heterojunction structure disposed on the substrate. The double heterojunction structure includes an n-type AlGaAs first cladding layer 2, an AlGaAs active layer 3 including a multiple quantum well structure, and a p-type AlGaAs second cladding layer 4. The semiconductor laser also includes a p-type GaAs contact layer 5 disposed on the second cladding layer 4 and electrodes 6 and 7 disposed on the substrate 1 and the contact layer 5, respectively. Opposed facets 8 and 9 of the semiconductor laser that form a resonator with the active layer and the first and second cladding layers are transverse to those layers. The active layer 3 includes alternatingly arranged well and barrier layers with relatively low and relatively high energy band gaps, respectively.

When the semiconductor laser is forward biased, electrons and holes are injected into the active layer and recombine to produce light. When the current flowing between the electrodes exceeds a threshold current level, laser oscillation occurs and coherent light is produced by the laser. The light is emitted through one of the facets 8 and 9 that is coated with an imperfect reflector. Because of the reflection of the laser light within the active layer at the facets and the presence of surfaces states at the facets, during operation of the laser some of the light is absorbed at and adjacent the facets, locally increasing the temperature of the laser. If the temperature rises sufficiently, COD can occur in which semiconductor materials may begin to melt, destroying the semiconductor laser.

In order to increase the power output that a semiconductor laser can safely produce without COD, so-called window structures have been included in semiconductor lasers at the facets. Those window structures generally have an effective energy band gap larger than other parts of the active layer so that light is less easily absorbed at the facets than internally in the laser. In semiconductor lasers including a multiple quantum well structure in the active layer, a known technique for producing window structures includes disordering the multiple quantum well structure in the vicinity of the facets. When the multiple quantum well structure is disordered, the distinct boundaries between the well and barrier layers are blurred, resulting in a more homogeneous active layer at the facets. The more homogeneous material has a larger energy band gap than the effective energy band gap of the quantum well structure so that light absorption is reduced. Disordering may be produced thermally or by the introduction of impurities in controlled regions of the active layer adjacent the facets. However, in disordering the multiple quantum well structure, it is sometimes difficult to control the degree and location of the disordering, resulting in the production of defective semiconductor lasers.

SUMMARY OF THE INVENTION

It is an object of the present invention to provide a semiconductor laser having opposed facets with reduced light absorption, permitting operation at higher power without COD, and that is easily manufactured.

It is another object of the present invention to provide a method for making a semiconductor laser including window structures at opposed facets with reduced light absorption that is relatively simple and easily controlled.

According to a first aspect of the invention, a semiconductor laser comprises a semiconductor substrate of a first conductivity type; a first cladding layer of the first conductivity type, an active layer comprising a multiple quantum well structure including alternating well and barrier layers, and a second cladding layer of a second conductivity type, opposite the first conductivity type, successively disposed on the substrate; a contact layer of the second conductivity type disposed on the second cladding layer; and first and second electrodes respectively disposed on the substrate and the contact layer, the laser including opposed first and second facets transverse to the first and second cladding layers, wherein the well layers have a first thickness adjacent the first and second facets and a second thickness, greater than the first thickness, within the semiconductor laser intermediate the first and second facets.

In another aspect of the invention, a method for producing a semiconductor laser according to the invention comprises forming spaced apart insulating films on a semiconductor substrate of a first conductivity type defining a central groove and two regions transverse to, contiguous to, and continuous with the central groove, the semiconductor substrate being exposed in the groove and the two regions; successively, epitaxially growing a first cladding layer of a first conductivity type, an active layer comprising a multiple quantum well structure including alternating well and barrier layers, a second cladding layer of a second conductivity type, opposite the first conductivity type, and a contact layer of the second conductivity type on the semiconductor substrate using a process producing thicker well layers in the groove than in the two regions; and forming first and second electrodes on the substrate and the contact layer, respectively.

According to another aspect of the invention, a method for producing a semiconductor layer according to the invention comprises forming a semiconductor substrate of a first conductivity type to include two opposed mesas separated by a central groove and adjacent two regions transverse to, contiguous to, and continuous with the central groove; successively, epitaxially growing a first cladding layer of a first conductivity type, an active layer comprising a multiple quantum well structure including alternating well and barrier layers, a second cladding layer of a second conductivity type, opposite the first conductivity type, and a contact layer of the second conductivity type on the semiconductor substrate using a process producing thicker well layers in the groove than in the two regions; and forming first and second electrodes on the substrate and the contact layer, respectively.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

DETAILED DESCRIPTION OF PREFERRED EMBODIMENTS

Figure 1:
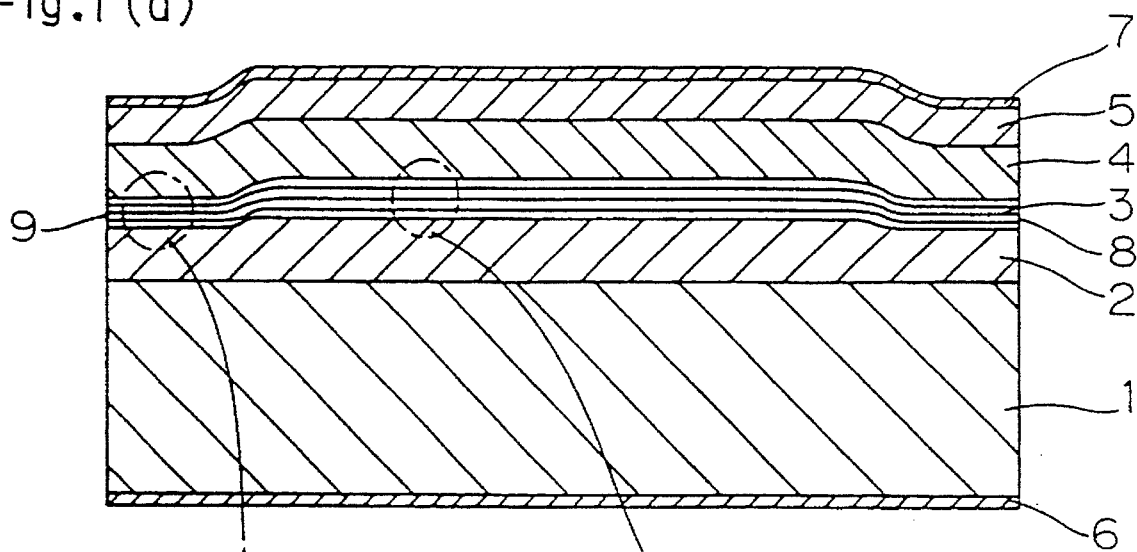
FIG. 1(a) is a cross-sectional view of a semiconductor laser in accordance with a first embodiment of the present invention.
FIGS. 1(b) and 1(c) are enlarged partial views of parts of FIG. 1(a).
Figure 1:
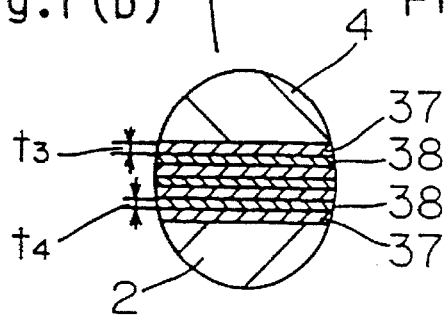
Figure 1:
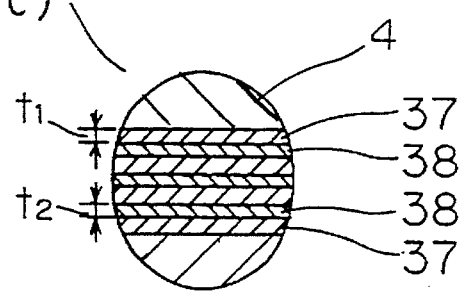

FIG. 1(a) is a cross-sectional view of a semiconductor laser in accordance with an embodiment of the invention. In all figures, the same elements are given the same reference numbers. The semiconductor laser of FIG. 1(a) has a structure similar to the prior art semiconductor laser of FIG. 5 except that the thickness of the active layer 3 varies. As can be seen from FIG. 1(a), the active layer 3 is thinner adjacent the facets 8 and 9 than in the central parts of the semiconductor laser intermediate the facets 8 and 9. FIGS. 1(b) and 1(c) are enlarged detail views of the thinner and thicker parts of the active layer 3. In FIG. 1(b), the detailed structure of the multiple quantum well active layer 3 is shown. That structure includes well layers 38 that are sandwiched by barrier layers 37. In this region of the semiconductor laser, the barrier layers 37 may be $Al_{0.2}Ga_{0.8}As$ and have a thickness $t_3$ of about 9 nanometers. The well layers 38 may be GaAs and have a thickness $t_4$ of about 7.2 nanometers. In the thicker part of the active layer 3, as illustrated in FIG. 1(c), the barrier layers 37 may have a thickness $t_1$ of about 10 nanometers and the well layers may have a thickness $t_2$ of about 8 nanometers. In this specific example, both the well layers and the barrier layers are about ten percent thinner in the vicinity of the facets 8 and 9 than in intermediate regions of the semiconductor laser remote from the facets.

Figure 5:
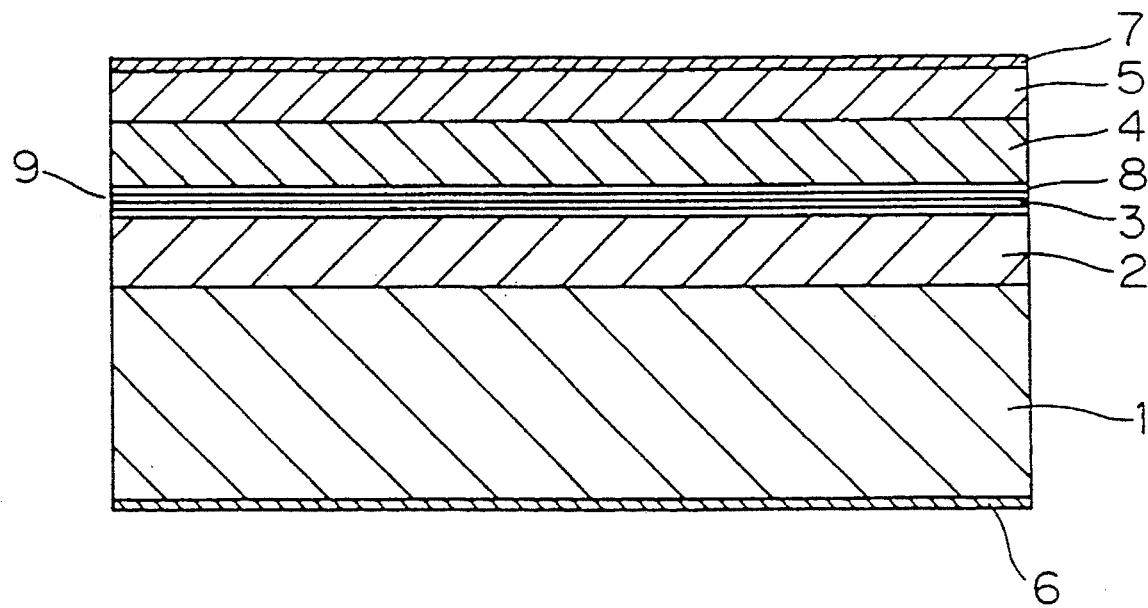
FIG. 5 is a cross-sectional view of a prior art semiconductor laser.

The fundamental operation of the semiconductor laser of FIG. 1(a) is the same as that of the semiconductor laser of FIG. 5. However, in the novel semiconductor laser with the varying thickness active layer 3, if the well layers 38 are thinner than about 20 nanometers, the effective energy band gap of the multiple quantum well structure active layer 3 varies significantly with the thickness of the well layer due to quantum mechanical effects. The effective energy band gap of such a multiple quantum well structure increases as the thickness of the well layer decreases. (The described multiple quantum well structure is symmetrical, i.e., has well layers of substantially the same thickness and barrier layers of substantially the same thickness. However, the invention is not limited to a perfectly symmetrical quantum well structure. What is important is that the variations in the thicknesses of the well layers locally alter the effective energy band gap of the quantum well structure active layer.) In the specific embodiment described above, since the well layers 38 are thinner in the vicinity of the facets by about ten percent compared to the thickness of the well layers in the central, intermediate portion of the laser remote from the facets, the energy band gap of the active layer 3 in the vicinity of the facets is larger than the energy band gap within the semiconductor laser. The larger energy band gap at the facets reduces light absorption so that the semiconductor laser according to the invention can be operated at a higher power than the prior art laser without risk of COD.

Although the specific embodiment of the invention described above includes well and barrier layers of specific thicknesses and materials, other materials and thicknesses can be employed to produce the same effect providing the well layers are thinner in the vicinity of the laser facets than in the central portion of the laser structure. Since it is the thickness of the well layers that affects the effective energy band gap of the active layer 3, the barrier layers may have constant thicknesses throughout the active layer providing the well layers are thinner in the vicinity of the facets than elsewhere within the semiconductor laser.

Figure 2:
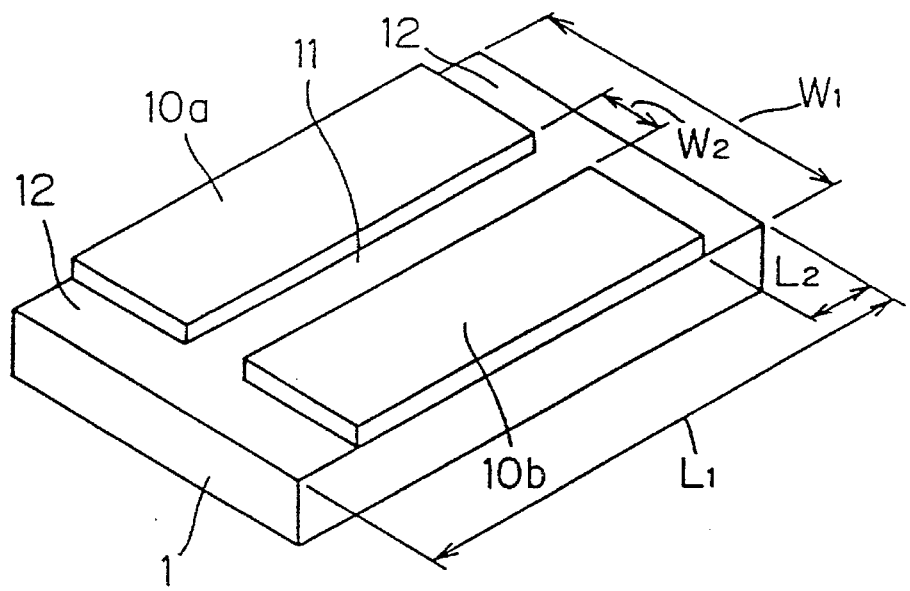
FIGS. 2(a)–2(c) are two perspective views and a sectional view illustrating a method of manufacturing the semiconductor laser of FIG. 1(a).
Figure 2:
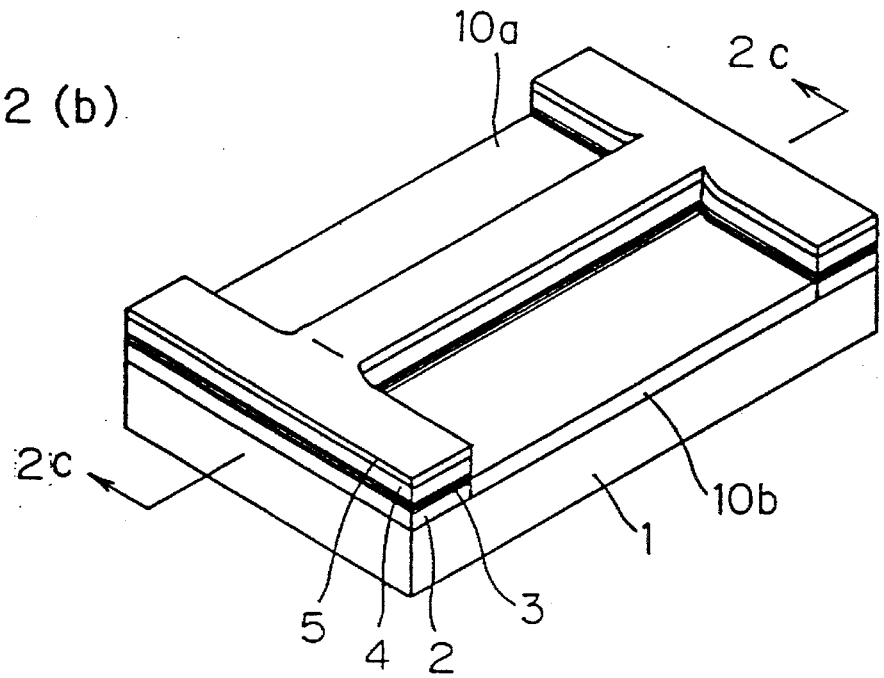
Figure 2:
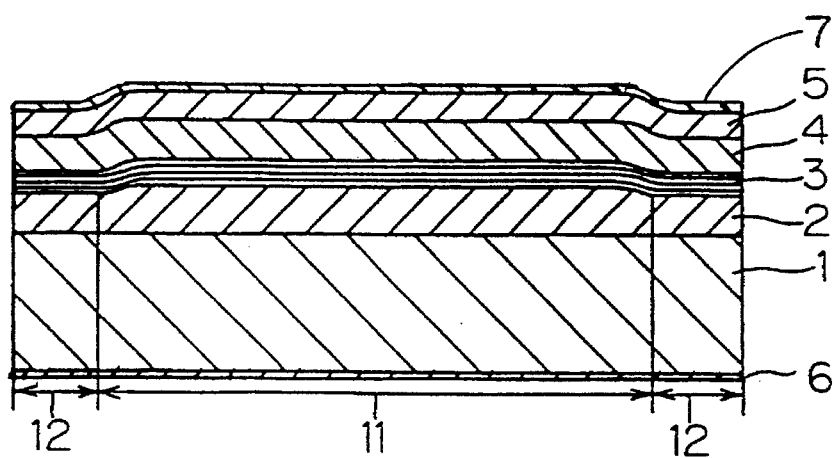

A method of making the semiconductor laser of FIG. 1(a) is illustrated in FIGS. 2(a)–2(c). In that method, as illustrated in FIG. 2(a), the n-type GaAs substrate 1 has masks 10a and 10b prepared on one of its surfaces for controlling epitaxial growth. The masks 10a and 10b are made of an insulator, such as $SiO_2$ or SiN, about 100 nanometers thick. Other insulating materials may be used for the masks 10a and 10b as well. The unmasked portion of the substrate 1 resembles an upper case Roman letter I. The central part of the I is a stripe-shaped region or groove 11 that extends in what becomes the resonator length direction of the semiconductor laser. That groove 11 has a width $W_2$, in one specific example of a semiconductor laser according to the invention, of 20 to 30 microns. The other parts of the letter I are the two regions 12 that are transverse to, contiguous to, and continuous with the groove 11. The two regions 12 are respectively disposed at what will become areas adjacent the two facets of the semiconductor laser. Those regions 12 have the full width of the substrate 1, $W_1$, in this example about 300 microns. The length of those regions 12, $L_2$, is about 10 to 20 microns. The overall length of the substrate, $L_2$, in this example, is 300 to 500 microns. While the representation in FIG. 2(a) shows an isolated rectangular substrate 1, in practice, a plurality of semiconductor lasers are formed at the same time on a semiconductor wafer. Each semiconductor laser has a rectangular area defined on the wafer that corresponds to the substrate 1. Those rectangular areas may be adjacent and in contact with other, end-to-end and side-to-side.

After the formation of the masks 10a and 10b, for example, by photolithography and etching, the n-type first cladding layer 2, the active layer 3, the second cladding layer 4, and the contact layer 5 are successively, epitaxially grown on the substrate 1. The epitaxial growth method chosen is one that results in the growth of crystalline semiconductor material preferentially on the semiconductor substrate 1 and not on the masks 10a and 10b. In such growth processes, the species produced in a vapor phase reaction are highly mobile on the surfaces of the masks 10a and 10b but less mobile on the semiconductor substrate 1, resulting in preferential epitaxial growth on the substrate 1 and essentially no material deposition on the insulating film masks. Examples of such growth techniques are metal organic chemical vapor deposition (MOCVD) and molecular beam epitaxy (MBE). The resulting structure after the epitaxial growth is shown in a perspective view in FIG. 2(b).

FIG. 2(c) is a cross-sectional view taken along line 2c–2c of FIG. 2(b). During the epitaxial growth process, since semiconductor material is not grown on the masks 10a and 10b, a large quantity of the species formed in the growth process reach the groove 11 where the substrate 1 is exposed between the masks 10a and 10b. In other words, the high mobility of the species on the mask 10a and 10b causes those species to migrate. Because of the geometry of the substrate and masks, as shown in FIG. 2(a), the species preferentially migrate to the groove 11 between the two masks 10a and 10b and the transverse regions 12. As a result of the geometry of the groove and transverse regions, the growing layers grow faster in the groove 11 than at the regions 12. Thus, the grown layers 2, 3, and 4 are thicker in the groove 11 than in the two transverse regions 12. Therefore, the first cladding layer 2, the well and barrier layers of the active layer 3, and the second cladding layer 4 are all thicker in the central region of the laser than adjacent the facets of the completed semiconductor laser. This result is achieved solely in the growth of the cladding and active layers. No additional process steps are required, as in the prior art, to form window regions by disordering a multiple quantum well structure active layer in the vicinity of the facets. Therefore, the window structures are produced simply and directly during the epitaxial growth process, improving the yield of the manufacturing process.

In order to complete the semiconductor laser, after growing the layers to produce the structure of FIG. 2(b), a current confinement structure for concentrating current flow through the resonator section of the semiconductor laser is produced. One embodiment of a current confinement structure may be produced by controlling electrode geometry. Electrodes 6 and 7 are formed on the substrate 1 and the contact layer 5 of FIG. 2(b), respectively. Then, the electrode 32 on the contact layer 5 is patterned to have a narrow stripe shape opposite the groove 11 and extending between the facets 8 and 9. That electrode geometry tends to direct the current flowing between the electrodes 6 and 7 to the part of the active layer 3 that is central along a direction transverse to the groove 11. Alternatively, a current confinement structure can include high resistivity or semi-insulating current blocking layers grown on opposite sides of and contacting the layers 2, 3, and 4, producing a buried heterojunction structure, for example, as described in more detail below with respect to FIGS. 4(b) and 4(c). If a current confinement structure is formed by growing or depositing high resistivity current blocking layers, after that step, the electrodes 6 and 7 are formed on the substrate 1 and the contact layer 5, respectively. If the electrode on the contact layer 5 is used as part of a current confinement structure, it is patterned. Subsequent to the formation of the electrodes 6 and 7, the facets 8 and 9 of the semiconductor laser are formed by cleaving, completing a semiconductor laser according to the invention.

Figure 3:
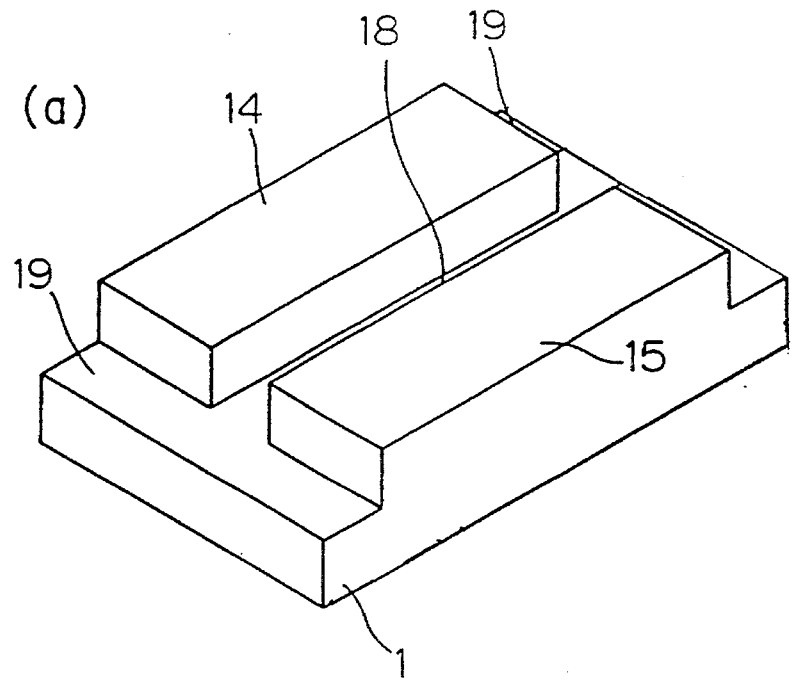
FIGS. 3(a)–3(c) are two perspective views and a sectional view illustrating a method of manufacturing the semiconductor laser of FIG. 1(a).
Figure 3:
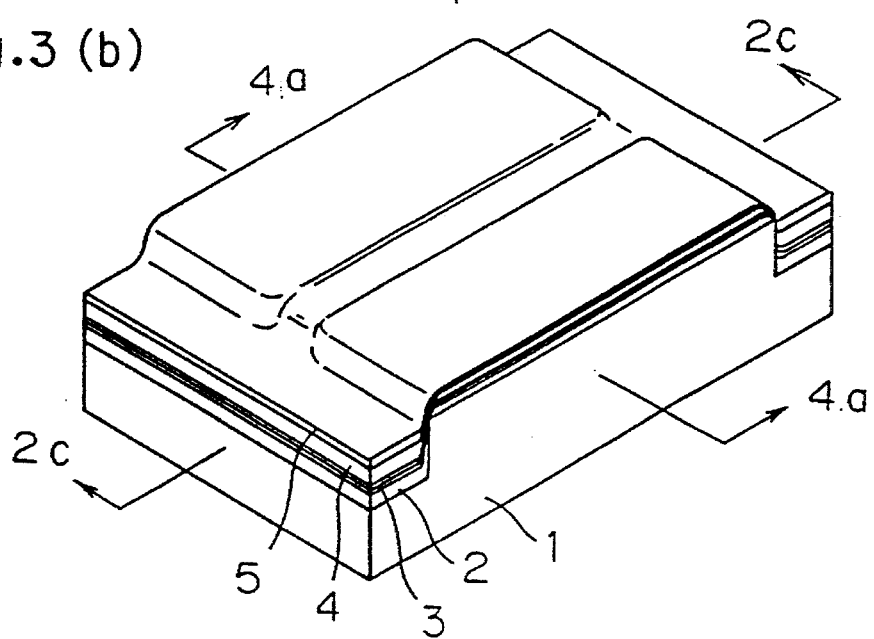
Figure 3:
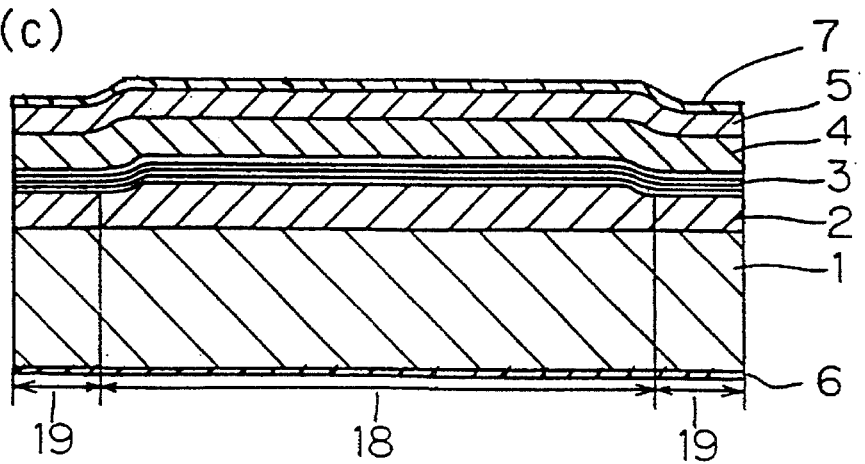

An alternative method of making the semiconductor laser of FIG. 1(a) is illustrated in FIGS. 3(a)–3(c). As shown in FIG. 3(a), the GaAs substrate 1 is shaped, for example, by masking and etching, to produce a structure having the same general shape as the substrate 1 of FIG. 2(a) including the masks 10a and 10b. The substrate 1 of FIG. 3(a) includes projecting mesas 14 and 15 defining a central groove 18 in which the resonator portion of the semiconductor laser will be formed by epitaxial growth. Two regions 19 at opposite ends of the substrate adjacent the mesas 14 and 15 are transverse to, contiguous to, and continuous with the central groove 18. Most preferably, the surface of the substrate 1 in the groove 18 and in the regions 19 lies in a single plane, as shown in FIG. 3(a). The two regions 19 are at locations that will be adjacent the facets of the completed semiconductor laser. The regions 19 and the groove 18 are connected and again form the shape of the Roman letter I. In a specific example, the dimensions of the shaped substrate 1 of FIG. 3(a) are essentially the same as those of the substrate 1 of FIG. 2(a) except that the mesas 14 and 15 are about 5 microns in height as compared to the 100 nanometer thickness of the masks 10a and 10b of FIG. 2(a).

The first cladding layer 2, the active layer 3, the second cladding layer 4, and the contact layer 5 are successively grown by MOCVD or MBE, just as described with respect to FIG. 2(b), to produce the structure shown in FIG. 3(b). In this instance, since semiconductor material is grown on the mesas 14 and 15 as well as between them, although the growth rate in the stripe region 18 is higher than the growth rates on the mesas 14 and 15, the difference in growth rates is not as large as in the embodiment of the invention described with respect to FIGS. 2(a) and 2(b). In any event, the same kind of structure is produced as a result of the epitaxial growth in both methods. The grown layers are thicker in the central portion of the semiconductor laser than adjacent the facets, producing the desired window structure as illustrated in the cross-sectional view of FIG. 3(c) taken along line 3c—3c of FIG. 3(b).

Figure 4:
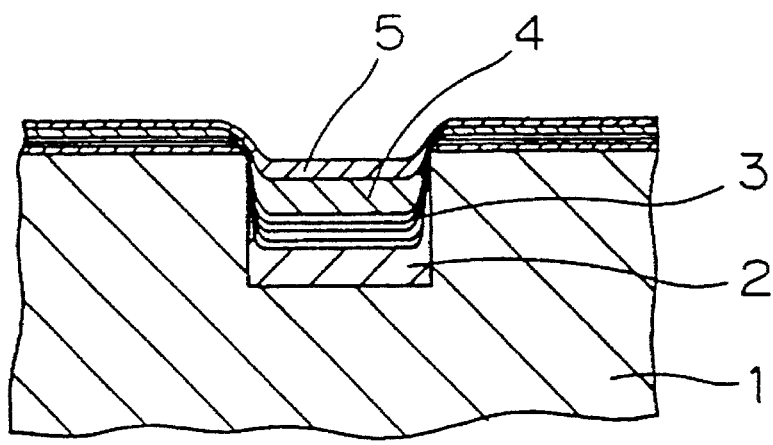
FIGS. 4(a)–4(c) are partial sectional views illustrating process steps that may be carried out subsequent to the step illustrated in FIG. 3(c) in a method of making a semiconductor laser according to an embodiment of the invention.
Figure 4:
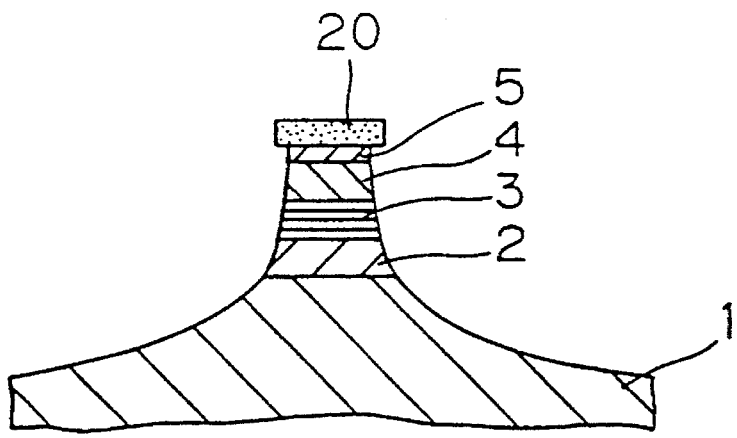
Figure 4:
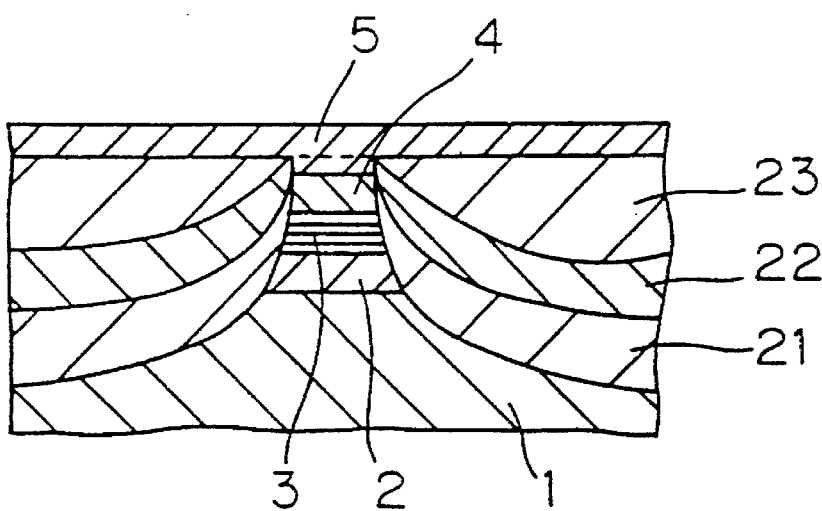

Because of the presence of the semiconductor layers on the mesas 14 and 15, it is important in this embodiment of the invention to add a current confinement structure. FIGS. 4(a)–4(c) illustrate a process for forming a current confinement structure. FIG. 4(a) is a cross-sectional view taken along line 4a—4a of FIG. 3(b). A stripe-shaped etching mask 20, illustrated in FIG. 4(b), is deposited on the contact layer 5 opposite the groove 18. Then, using the mask 20 to protect part of the grown layers, the laser structure is etched to remove the grown layers outside of the groove 18 and parts of the substrate 1 to produce the structure shown in FIG. 4(b). Thereafter, as illustrated in FIG. 4(c), a p-type AlGaAs layer 21, an n-type AlGaAs layer 22, and a p-type AlGaAs layer 23 are successively grown adjacent the mesa with the mask 20 in place to prevent the growth of semiconductor materials on the contact layer 5 at the top of the mesa. The mask 20 is subsequently removed and additional p-type GaAs is deposited as part of the contact layer 5 extending from the mesa across the p-type layer 23. Thus, the three grown layers 21–23, in combination with the contact layer 5 and the substrate 1, form a p-n-p-n current blocking structure. As described above, the semiconductor laser is completed by forming electrodes 6 and 7 on the contact layer and the substrate 1, respectively, followed by cleaving to produce the laser facets.

In the specific embodiments of the invention described above, the quantum well structure includes layers of AlGaAs. Other materials may be used for those layers and for the cladding layers, such as materials including AlInGaP.

I claim:

1. A method of making a semiconductor laser comprising:

forming a semiconductor substrate of a first conductivity type to include two opposed mesas separated by a central groove and adjacent two regions transverse to, contiguous to, and continuous with the central groove;

successively, epitaxially growing a first cladding layer of a first conductivity type, an active layer comprising a multiple quantum well structure including alternating well and barrier layers, a second cladding layer of a second conductivity type, opposite the first conductivity type, and a contact layer of the second conductivity type on the semiconductor substrate using a process producing thicker well layers in the groove than in the two regions; and forming first and second electrodes on the substrate and the contact layer, respectively.

2. The method of claim 1 including epitaxially growing the layers by metal organic chemical vapor deposition.

3. The method of claim 1 including epitaxially growing the layers by molecular beam epitaxy.

4. The method of claim 1 including, after forming the first and second electrodes, cleaving to form opposed facets transverse to the first and second cladding layers.

5. The method of claim 1 including preparing a current confinement structure for confining current flow between the first and second electrodes to the active layer.

6. The method of claim 5 including preparing the current confinement structure by etching the semiconductor substrate to remove the mesas, thereby exposing the first cladding layer, the active layer, and the second cladding layer at side surfaces and growing at least three layers of alternatingly opposite conductivity types on the substrate at the side surfaces of the first cladding layer, active layer, and second cladding layer.

* * * * *